US007983055B2

United States Patent
Kim et al.

(10) Patent No.: US 7,983,055 B2
(45) Date of Patent: Jul. 19, 2011

(54) PRINTED CIRCUIT BOARD WITH EMBEDDED CAVITY CAPACITOR

(75) Inventors: Han Kim, Yongin-si (KR); Je-Gwang Yoo, Yongin-si (KR); Chang-Sup Ryu, Yongin-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 806 days.

(21) Appl. No.: 12/010,436

(22) Filed: Jan. 24, 2008

(65) Prior Publication Data

US 2009/0086451 A1 Apr. 2, 2009

(30) Foreign Application Priority Data

Sep. 28, 2007 (KR) .................. 10-2007-0097720

(51) Int. Cl.
*H05K 1/18* (2006.01)
*H01L 27/108* (2006.01)

(52) U.S. Cl. ........ 361/763; 361/761; 361/762; 257/296; 257/301

(58) Field of Classification Search .................. None
See application file for complete search history.

(56) References Cited

U.S. PATENT DOCUMENTS

| 6,344,413 | B1 * | 2/2002 | Zurcher et al. | 438/678 |
| 6,734,483 | B2 * | 5/2004 | Morand et al. | 257/301 |
| 6,784,519 | B2 * | 8/2004 | Iwamoto et al. | 257/532 |
| 6,992,344 | B2 * | 1/2006 | Coolbaugh et al. | 257/301 |
| 7,456,459 | B2 * | 11/2008 | Wan | 257/296 |

FOREIGN PATENT DOCUMENTS

| KR | 2001-0057047 | 7/2001 |
| KR | 10-0337947 | 5/2002 |

OTHER PUBLICATIONS

Office Action mailed on Jul. 22, 2008 and issued in corresponding Korean Patent Application No. 10-2007-0097720.

* cited by examiner

*Primary Examiner* — Boris L Chervinsky

(57) ABSTRACT

A printed circuit board having an embedded cavity capacitor is disclosed. According to an embodiment of the present invention, the printed circuit board having the embedded cavity capacitor, the printed circuit board can include two conductive layers to be used as a power layer and a ground layer, respectively; and a first dielectric layer, placed between the two conductive layers, wherein at least one cavity capacitor is arranged in a noise-transferable path between a noise source and a noise prevented destination which are placed on the printed circuit board, the cavity capacitor being formed to allow a second dielectric layer to have a lower stepped region than the first dielectric layer, the second dielectric layer using the two conductive layers as a first electrode and a second electrode, respectively, and placed between the first electrode and the second electrode.

15 Claims, 26 Drawing Sheets

Accordingly, it is necessary to intercept or decrease the noise of the high frequencies between the RF circuit 140 and the digital circuit 130.

FIG. 2 is a sectional view showing an electromagnetic bandgap structure that solves a problem mixed signals between an analog circuit and a digital circuit in accordance with a conventional art, and FIG. 3 is a plan view showing a metal plate configuration of the electromagnetic bandgap structure shown in FIG. 2. FIG. 4 is a perspective view showing the electromagnetic bandgap structure shown in FIG. 2, and FIG. 5 is a schematic view showing an equivalent circuit of the electromagnetic bandgap structure shown in FIG. 2.

The electromagnetic bandgap structure 200 includes a first metal layer 210-1, a second metal layer 210-2, a first dielectric layer 220a a second dielectric layer 220b, a meal plate 232 and a via 234.

The first metal layer 210-1 and the metal plate 232 are connected to each other through the via 234. A mushroom type structure 230 is formed to include the metal plate 232 and the via 234 (refer to FIG. 4).

If the first meal layer 210-1 is a ground layer, the second metal layer 210-2 is a power layer. Also, if the first metal 210-1 is the power layer, the second layer 210-2 is the ground layer.

In other words, the repeated formation of the mushroom type structure 230 (refer to FIG. 3) results in a bandgap structure preventing a signal having a certain frequency band from being penetrated. At this time, the mushroom type structures 230, including the metal plates 232 and the vias 234, are repeatedly formed between the ground layer and the power layer.

The function preventing a signal having a certain frequency band from being penetrated, which is based on resistance $R_E$ and $R_P$, inductance $L_E$ and $L_P$, capacitance $C_E$, $C_P$ and $C_G$ and conductance $G_P$ and $G_E$, is approximated to the equivalent circuit shown in FIG. 5.

A mobile communication terminal is a good example for an electronic apparatus employing the board realized with the digital circuit and the RF circuit together. In the case of the mobile communication terminal, solving the problem mixed signals needs the noise shielding of an operation frequency band of the RF circuit between 0.8 and 2.0 GHz. The small sized mushroom type structure is also required. However, the foregoing electromagnetic bandgap structure may not satisfy the two conditions needed to solve the problem mixed signals. In other words, since the smaller sized mushroom type structure causes the bandgap frequency band shielding the noise to be increased, the mobile communication terminal is not effectively operated in the operation frequency band of the RF circuit between 0.8 and 2.0 GHz. Also, the larger sized mushroom type structure needs the increase of the size, thickness and volume of the printed circuit board.

In accordance with the conventional art, the mushroom type structures are required to be repeatedly arranged close to each other in order to be used as the electromagnetic bandgap structure. However, this may have a bad influence on signal integrity. Here, the signal integrity indicates the accuracy of signal transfer such as whether to delay transferring a signal and whether to maintain a signal type as a performance evaluation index related to how stable a signal is transferred in time.

Also, in the case of having the complex line structure in which the digital circuit and the RF circuit are realized on the same board like the main board of a mobile phone or mounting a lot of active elements and passive elements in the same small-sized board as a system in package (SiP) board, a lot of

PRINTED CIRCUIT BOARD WITH EMBEDDED CAVITY CAPACITOR

CROSS-REFERENCE TO RELATED PATENT APPLICATIONS

This application claims the benefit of Korean Patent Application No. 10-2007-0097720, filed on Sep. 28, 2007, in the Korean Intellectual Property Office, the disclosure of which is incorporated herein in its entirety by reference

BACKGROUND OF THE INVENTION

1. Field of the Invention

The present invention relates to a printed circuit board, more specifically to a printed circuit board having an embedded cavity capacitor using a cavity capacitor embedded in the printed circuit board as an electromagnetic bandgap structure.

2. Background Art

Various apparatuses such as mobile communication terminals, personal digital assistants (PDA), laptop computers and digital multimedia broadcasting (DMB) devices have been launched in order to meet today's trend that mobility is considered as one of the most important issues.

Such apparatuses include a printed circuit board, which is configured to compound analog circuits (e.g. radio frequency (RF) circuits) and digital circuits for wireless communication.

FIG. 1 is a sectional view showing a printed circuit board including an analog circuit and a digital circuit. Although a 4-stacked in printed circuit board is illustrated, various printed circuit boards such as 2 and 6-stacked in printed circuit boards can be applied. Here, the analog circuit is assumed to be an RF circuit.

The printed circuit board 100 includes metal layers 110-1, 110-2, 110-3 and 110-4 (hereinafter, collectively referred to as 110), dielectric layers 120-1, 120-2 and 120-3 (hereinafter, collectively referred to as 120) stacked in between the metal layers 110, a digital circuit 130 mounted on the top metal layer 110-1 and an RF circuit 140.

If it is assumed that the metal layer 110-2 is a ground layer and the metal layer 110-3 is a power layer, a current passes through a via 160 connected between the ground layer 110-2 and the power layer 110-3 and the printed circuit board 100 performs a predetermined operation or function.

Here, an operation frequency of the digital circuit 130 and an electromagnetic (EM) wave 150 by harmonics components are transferred to the RF circuit 140, to thereby generate a problem mixed signals. The mixed signal problem is generated due to the EM wave, having a frequency within the frequency band in which the RF circuit 140 is operated, in the digital circuit 130. This problem results in obstructing the accurate operation of the RF circuit 140. For example, when the RF circuit 140 receives a signal having a certain frequency band, transferring the EM wave 150 including the signals having the certain frequency band from the digital circuit 130 may make it difficult to accurately receive the signal having the certain frequency band.

Solving the problem mixed signals becomes more difficult due to the higher operation frequency of the digital circuit 130 according to the increased complexity of electronic apparatuses.

The decoupling capacitor method, which is a typical solution for power noise, is not adequate for high frequencies.

SUMMARY OF THE INVENTION

Accordingly, the present invention provides a printed circuit board having an embedded cavity capacitor that uses the cavity capacitor as an electromagnetic bandgap structure to solve a problem mixed signals, various electrical parts and elements including an analog circuit and a digital circuit being mounted in the printed circuit board.

The present invention also provides a printed circuit board having an embedded cavity capacitor that can simply prevent the noise having a desired frequency band by using the cavity capacitor having a simple structure as an electromagnetic bandgap structure.

In addition, the present invention provides a compact, thin film and light-weighted printed circuit board having an embedded cavity capacitor with high capacity and high efficiency through a simple fabrication process and a reduced fabrication time and cost.

An aspect of the present invention features a printed circuit board having an embedded cavity capacitor, including two conductive layers to be used as a power layer and a ground layer, respectively; and a first dielectric layer, placed between the two conductive layers. At this time, at least one cavity capacitor can be arranged in a noise-transferable path between a noise source and a noise prevented destination which are placed on the printed circuit board, the cavity capacitor being formed to allow a second dielectric layer to have a lower stepped region than the first dielectric layer, and the second dielectric layer using the two conductive layers as a first electrode and a second electrode, respectively, and placed between the first electrode and the second electrode.

Here, the printed circuit board can be mounted with a digital circuit and an analog circuit, and the noise source and the noise prevented destination can correspond to one and the other, respectively, of positions in which the digital circuit and the analog circuit are supposed to be mounted in the printed circuit board.

The second dielectric layer can be formed to have a higher dielectric constant than the first dielectric layer.

The cavity capacitor can use any one of the two conductive layers as any one electrode as it is.

The cavity capacitor can have any one shape of a circle, an ellipse and a polygon when viewed from an upper part of the printed circuit board.

The cavity capacitor can be formed close to any one of the two conductive layers. At this time, a conductive material can be charged to a cavity formed in a space between the other conductive layer and the cavity capacitor.

An etched pattern can be formed in an open curved shape in a surrounding area of a part corresponding to the position in which the cavity capacitor is formed in any one of the two conductive layers. At this time, the etched pattern can have a spiral shape.

The cavity capacitor can be coupled to an inductance component by the etched pattern, connected to the cavity capacitor in series, to intercept the transfer of an electromagnetic wave having a desired frequency band.

The cavity capacitor can be arranged in a band structure in the noise transferable path.

The band structure can have a shape enveloping at least one of the noise source and the noise prevented destination. At this time, the band structure can have any one of a closed loop shape, a rectangular shape with one side open, and an 'L' shape.

The band structure can have a straight-line shape of at least one line to separate the noise source and the noise prevented destination by crossing the area between the noise source and the noise prevented destination.

The band structure can have any one of a point-band structure by a plurality of cavity capacitors, a line-band structure by one cavity capacitor and a structure combined with the point-band structure and the line-band structure.

BRIEF DESCRIPTION OF THE DRAWINGS

These and other features, aspects and advantages of the present invention will become better understood with regard to the following description, appended claims and accompanying drawings where:

DESCRIPTION OF THE EMBODIMENTS

Figure 1:
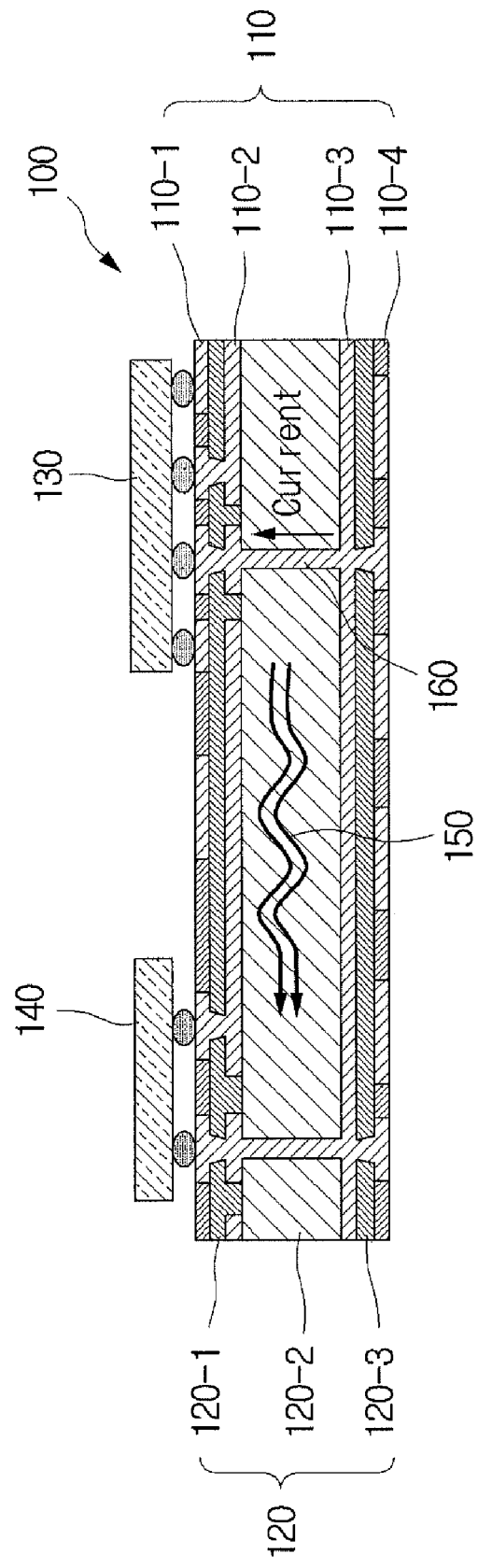
FIG. 1 is a sectional view showing a printed circuit board including analog circuit and a digital circuit.
Figure 2:
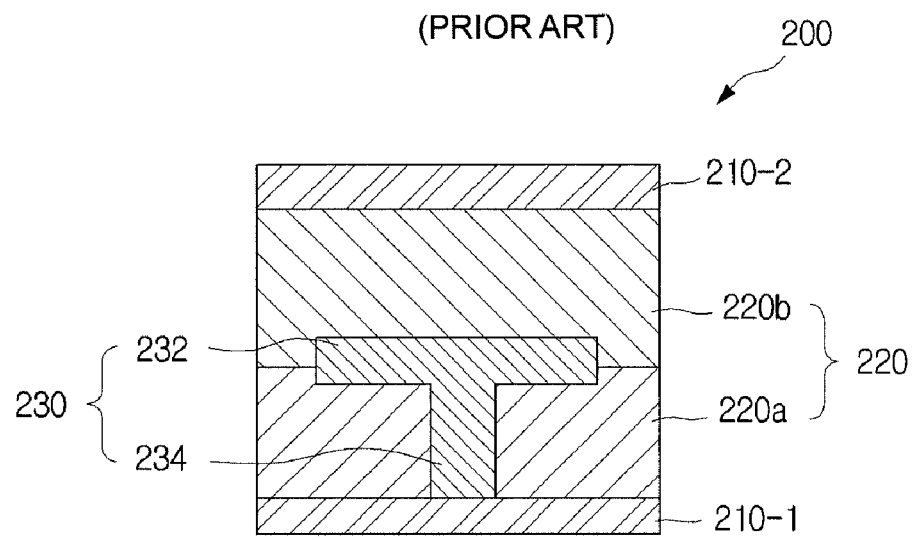
FIG. 2 is a sectional view showing an electromagnetic bandgap structure that solves a problem mixed signals between an analog circuit and a digital circuit in accordance with a conventional art.
Figure 3:
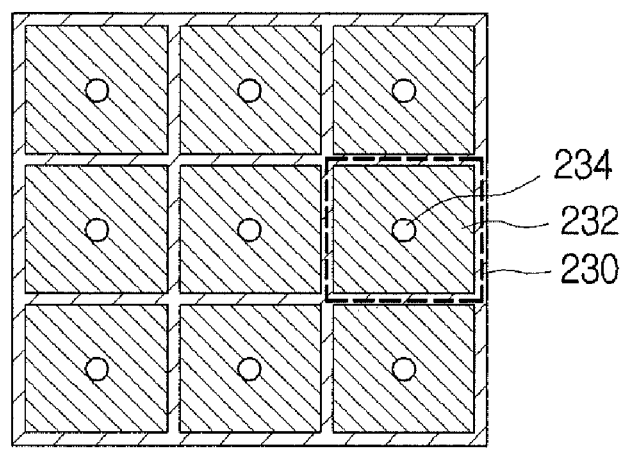
FIG. 3 is a plan view showing a metal plate configuration of the electromagnetic bandgap structure shown in FIG. 2.
Figure 4:
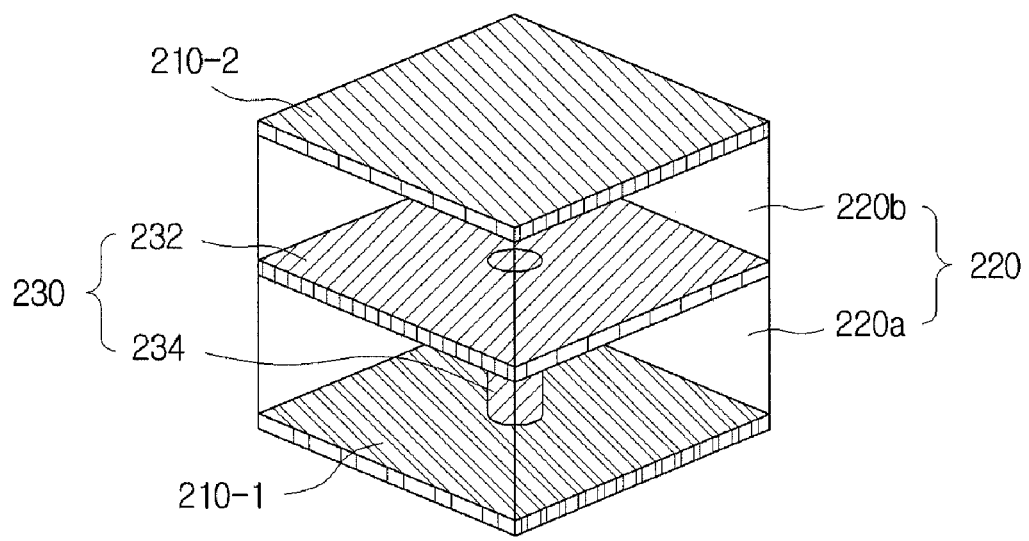
FIG. 4 is a perspective view showing the electromagnetic bandgap structure shown in FIG. 2.
Figure 5:
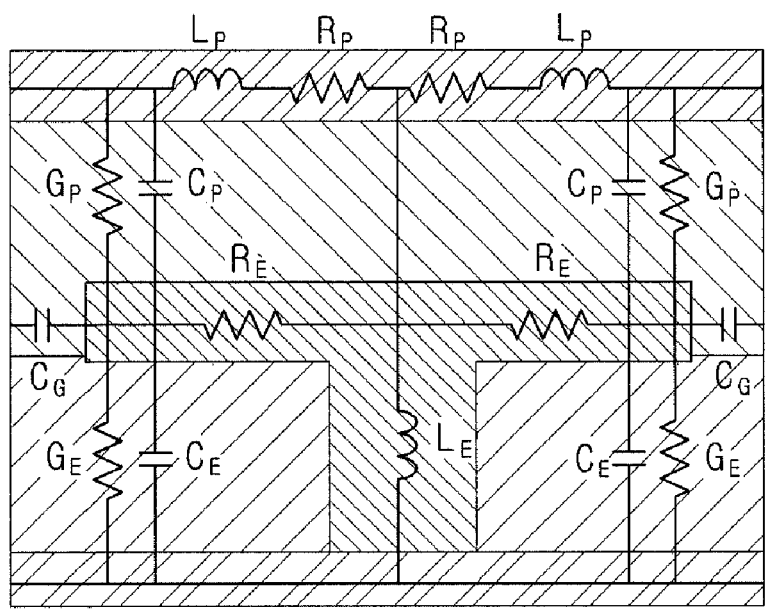
FIG. 5 is a schematic view showing an equivalent circuit of the electromagnetic bandgap structure shown in FIG. 2.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. Throughout the drawings, similar elements are given similar reference numerals. Throughout the description of the present invention, when describing a certain technology is determined to evade the point of the present invention, the pertinent detailed description will be omitted.

Terms such as "first" and "second" can be used in describing various elements, but the above elements shall not be restricted to the above terms. The above terms are used only to distinguish one element from the other. For instance, the first element can be named the second element, and vice versa, without departing the scope of claims of the present invention. The term "and/or" shall include the combination of a plurality of listed items or any of the plurality of listed items.

When one element is described as being "connected" or "accessed" to another element, it shall be construed as being connected or accessed to the other element directly but also as possibly having another element in between. On the other hand, if one element is described as being "directly connected" or "directly accessed" to another element, it shall be construed that there is no other element in between.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Unless otherwise defined, all terms, including technical terms and scientific terms, used herein have the same meaning as how they are generally understood by those of ordinary skill in the art to which the invention pertains. Any term that is defined in a general dictionary shall be construed to have the same meaning in the context of the relevant art, and, unless otherwise defined explicitly, shall not be interpreted to have an idealistic or excessively formalistic meaning.

Hereinafter, the general type of a printed circuit board having an embedded cavity capacitor and a fabrication method thereof will be described with FIG. 6 through FIG. 8B before the description related to the principle in which the cavity capacitor embedded in the printed circuit board in accordance with the present invention with reference to the accompanying drawings.

Figure 6:
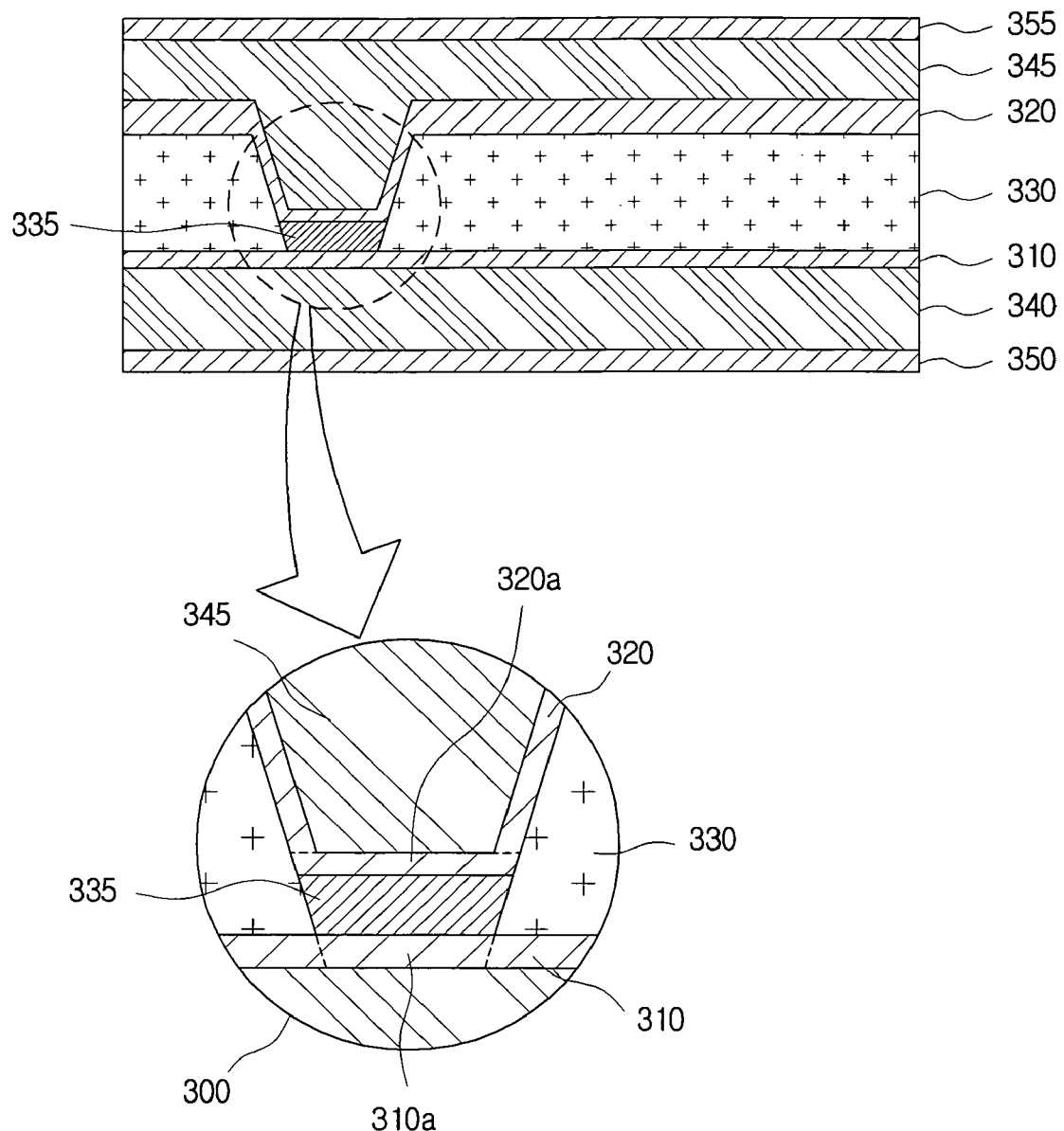
FIG. 6 is a side view showing a printed circuit board having an embedded cavity capacitor in accordance with a first embodiment of the present invention.

FIG. 6 is a side view showing a printed circuit board having an embedded cavity capacitor in accordance with a first embodiment of the present invention Referring to FIG. 6, the printed circuit board in accordance with an embodiment of the present invention can include a first conductive layer 310, a second conductive layer 320, a dielectric layer 330 placed between the first conductive layer 310 and the second conductive layer 320 and a cavity capacitor 300 embedded between the first conductive layer 310 and the second conductive layer 320. Here, the cavity capacitor 300 can consist of a first electrode 310a, a second electrode 320a and a second dielectric layer 335 placed between the first electrode 310a and the second electrode 320a.

At this time, FIG. 6 shows a printed circuit board having a both side multi-layer in which the first conductive layer 310 is placed between other dielectric layers (i.e. a third dielectric layer 340 and a fourth dielectric layer 345), and the second conductive layer 320 is placed between other conductive layers (i.e. a third conductive layer 350 and a fourth conductive layer 355). However, the printed circuit board as shown in FIG. 6 is merely an example. It is obvious that the present invention is not limited to the example. Any printed circuit board having the structure, including two conductive layers to be used as each of a power layer and a ground layer between which the cavity capacitor can be embedded, is applicable to the present invention without restriction. Accordingly, the below description is based on the relationship between the first conductive layer 310, the second conductive layer 320 and the first dielectric layer 330, which are placed in surroundings based on a position located with the cavity capacitor 300, and the first electrode 310a, the second electrode 320a and the second dielectric layer 335, which form the cavity capacitor 300.

The cavity capacitor 300 of the present invention can use each of the first conductive layer 310 and the second conductive layer 320 of the printed circuit board as electrodes. For example, in the case of FIG. 1, a part (refer to 310a in FIG. 6) corresponding to the surface, in contact with the second dielectric layer 335, of the first conductive layer 310 can be used as the first electrode of the cavity capacitor 300. Also, a part (refer to 320a in FIG. 1) corresponding to the surface, in contact with the second dielectric layer 335, of the second conductive layer 320 can be used as the second electrode of the cavity capacitor 300. Here, since one of the first conductive layer 310a and the second conductive layer 320a of the printed circuit board is used as the power layer and the other is used as the ground layer, the first electrode 310a and the second electrode 320a will be able to generally function as one capacitor by supplying a power having a different value to the first electrode 310a and the second electrode 320a, respectively, together with the second dielectric layer 355 therebetween.

As such, in accordance with the present invention, since the cavity capacitor embedded in the printed circuit board uses the two conductive layers, which are used as the power layer and the ground layer in the printed circuit layer, as each of the electrodes as they are, it is unnecessary to add an additional stacking process for forming an electrode and an additional connection process using a via of the power layer or the ground layer. Accordingly, the present invention can have a very simple manufacture method based on an aspect of process. Beside that, the printed circuit board of the present invention can have a very simple structure. As a result, the complexity of printed circuit board can be largely reduced and a compact and thin film printed circuit board can be easily manufactured, as compared with the conventional printed circuit board.

The second dielectric layer 335 included in the cavity capacitor 300 can be formed with a stepped region that is lower than the first dielectric layer 330 stacked in a surrounding area of the second dielectric layer 335. As such, if the stacked in thickness of the second dielectric layer 335 is lower than a dielectric layer in the surrounding area, the electric capacitor of the cavity capacitor 300 can be increased in reverse proportion thereto. Also, if the second dielectric layer 335 is formed to consist of a dielectric material having a higher dielectric constant than the first dielectric layer 330 in the surrounding area, the cavity capacitor having higher capacity and higher efficiency will be able to be manufactured. Of course, the more increased surface of the second dielectric layer 330 can obviously result in the increase of the electric capacity.

Hereinafter, the cavity capacitor fabrication method in accordance with an embodiment of the present invention will be described with reference to FIG. 7A through FIG. 7D.

Figure 7A:
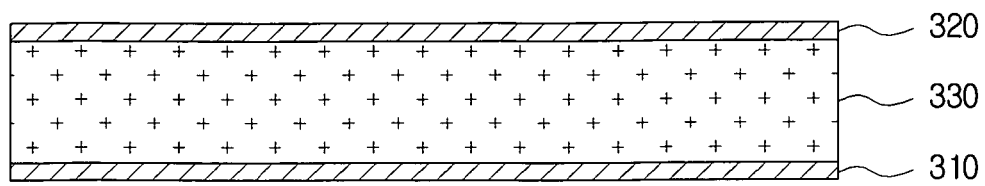
FIG. 7A through 7D illustrate a method of fabricating a cavity capacitor based on the printed circuit board shown in FIG. 6.
Figure 7B:
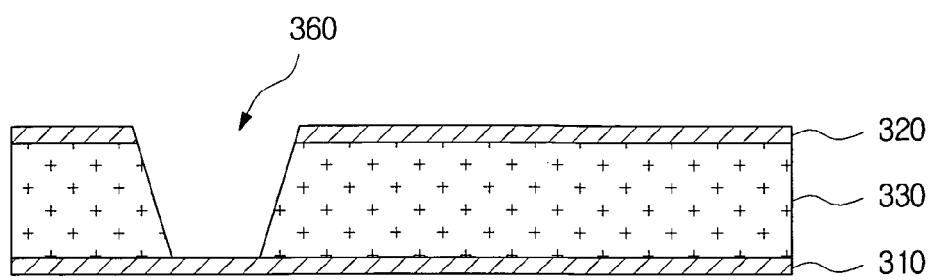

FIG. 7A through 7D illustrate the method of fabricating a cavity capacitor based on the printed circuit board shown in FIG. 6. Particularly, FIG. 7A through 7B illustrate the elements placed between the first conductive layer 310 and the second conductive layer 320 in FIG. 6 for the convenience of illustration.

Referring to FIG. 7A, the structure in which the first conductive layer 310, the second conductive layer 320 and the first dielectric layer 330 placed therebetween are illustrated. For example, copper clad laminates in which a dielectric material is placed and both sides of the dielectric material are clad with copper can have the same structure as FIG. 7A.

Referring to FIG. 7B, the second conductive layer 320 and the first dielectric layer 330 can be removed and the first conductive layer 310 can remain in the structure of FIG. 7A in order that a cavity 360 can be formed at a position between the first conductive layer 310 and the second conductive layer 320.

For example, the cavity 360 can be formed at a position between the first conductive layer 310 and the second conductive layer 320 by using a laser drill process. At this time, the size, region And shape of the cavity 360 formed through the laser drill processor can function as a first factor that determines the property (e.g. electric capacity) of the cavity capacitor, finally manufactured. Accordingly, the printed circuit board is required to be designed so as to have the optimized properties considering design specifications, conditions and applicable technological fields.

As an example, the cavity 360 can have various shapes such as circles, ellipses, squares, line-bands and triangles (refer to FIG. 11A through FIG. 11F). Of course, it is obvious that the cavity 360 can have various shapes, sizes and areas.

The reason that the first conductive layer 210 is not removed in FIG. 7B is because a part corresponding to the surface, formed with the cavity 360, of the first conductive layer 310 can be used as an electrode of the cavity capacitor later. Accordingly, although the first conductive layer 310 is used as an electrode of the cavity capacitor as it is in FIG. 7B, it is obvious that various modifications are possible within the limitation in which the first conductive layer 310 can be used as the electrode of the cavity capacitor.

Figure 7C:
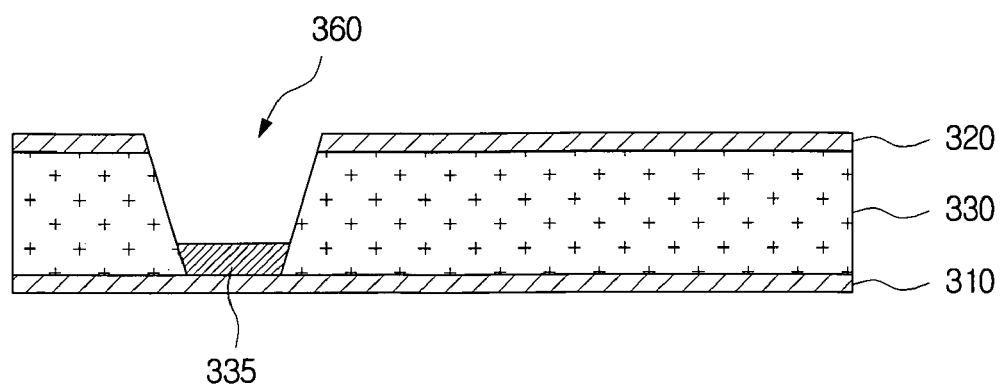

Referring to FIG. 7C, the dielectric material can be stacked in the cavity 360 formed. At this time, the second dielectric layer 335 having a lower stepped region than the first dielectric layer 330 can be formed in the cavity 360 by determining the stacked thickness of the dielectric material to be lower than the first dielectric layer 330. Also, at this time, a material having a higher dielectric constant than the dielectric layer 330 can be used as the dielectric material stacked in the cavity 360 as described above.

Accordingly, if the thickness, region And dielectric material of the second dielectric layer 335, stacked in the cavity 360 through the process, are appropriately adjusted, the cavity capacitor having the electrical property desired by a designer can be manufactured.

Of course, at this time, since it is unnecessary that the second dielectric layer 335 has a different dielectric material from the first dielectric layer 330, if the second dielectric layer 335 having the same dielectric material as the first dielectric layer 330 is formed, the first dielectric layer 330 may not be completely removed and a part of the first dielectric layer 330 may remain in an etching process of FIG. 7B. Of course, in this case, the same process as FIG. 7C may be unnecessary.

Figure 7D:
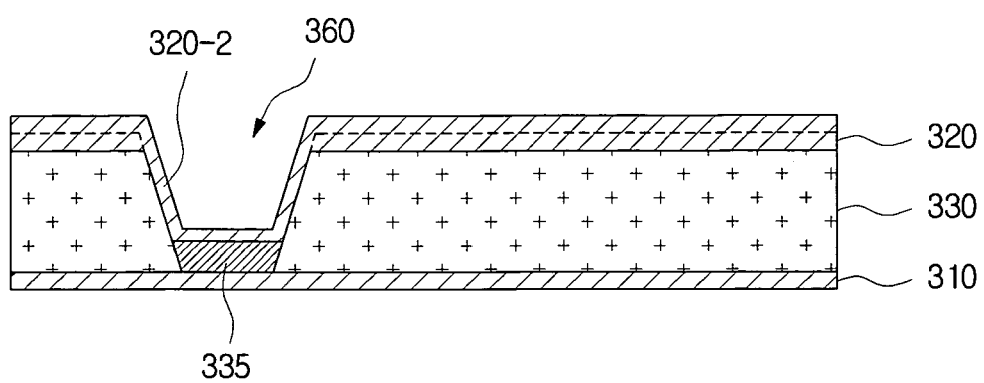

Referring to FIG. 7D, a conductive material can be stacked in an upper part of the second dielectric layer 335 and a lateral side part (i.e. an inclined surface) of the cavity 360 (refer to 320-2 of FIG. 7D). Through the stacking process of the conductive material, the other electrode can be formed in the upper part of the second dielectric layer 335. The formed electrode can be electrically connected to the second conductive layer 320.

FIG. 7D uses the method stacking thinly the conductive material on the upper part of the second dielectric layer 335 and the lateral side part of the cavity 360 in order to be electrically connected to the second conductive layer 320. Of course, various methods can be alternatively used.

For example, the method charging all spaces of the cavity 360 excluding a part in which the second dielectric layer 335 is stacked by using the conductive material can be used. This is illustrated through FIG. 8A through 8B as another embodiment of the present invention.

Figure 8A:
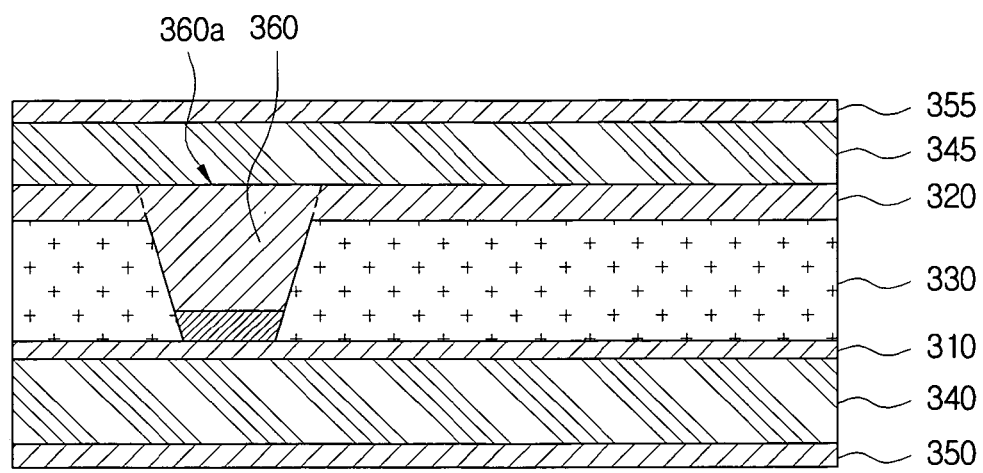
FIG. 8A is a side view showing a printed circuit board having an embedded cavity capacitor in accordance with a second embodiment of the present invention.
Figure 8B:
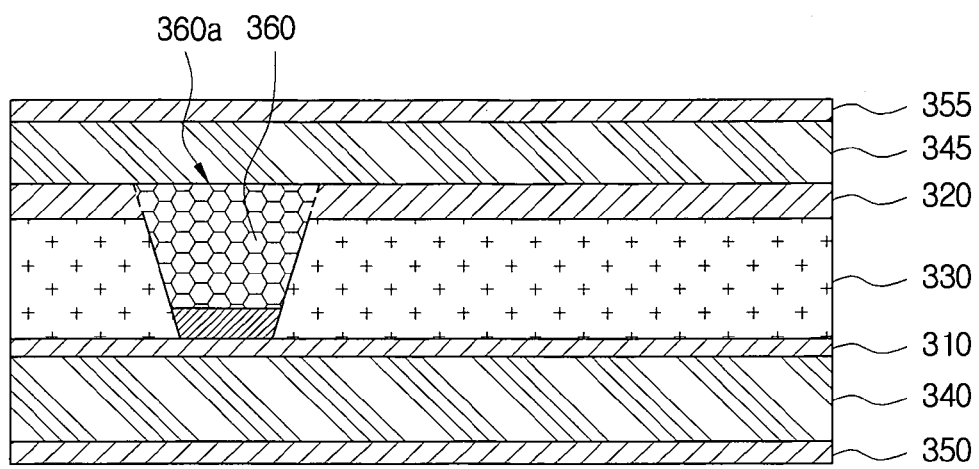
FIG. 8B is a side view showing a printed circuit board having an embedded cavity capacitor in accordance with a third embodiment of the present invention.

While FIG. 8A shows the part, stacked with the second dielectric layer 335, of the cavity 360 is completely filled with the same material as the material forming the second conductive layer 320, FIG. 8B shows the part, stacked with the second dielectric layer 335, of the cavity 360 is filled with the different material (e.g. a conductive paste) from the material forming the second conductive layer 320.

As described above, it is possible to manufacture the cavity capacitor embedded in the printed circuit board through the one-time etching process for forming the cavity 360 and the two-time stacking process for forming the second dielectric layer 335 and the electrode in accordance with the present invention. Accordingly, the manufacture process can be very simplified and also the manufacture time and cost can be largely reduced.

The above description is based on the printed circuit board having the embedded cavity capacitor, illustrated FIG. 6 through FIG. 8B. In the forgoing description with reference to FIG. 6 through FIG. 8B, since the cavity capacitor 300 is formed close to the first conductive layer 310 of the printed circuit board, the second electrode 320a of the cavity capacitor 300 can be electrically connected to the second conductive layer 320 in the U-shape. Alternatively, it can be easily understood by any person of ordinary skill in the art that the cavity capacitor having various shapes is able to be embedded in the printed circuit board in accordance with the present invention.

In other words, if the cavity capacitor 300 is possible to be placed between the first conductive layer 310 and the second conductive layer 320 and is possible to electrically function as a capacitor by allowing the second dielectric layer 335 to have a lower stepped region than the first dielectric layer 330 in a surrounding area, the shape and stacked structure of the cavity capacitor 300 may have no limitation.

For example, since the cavity capacitor of the present invention can be formed close to the second conductive layer 320, the cavity capacitor can have various shapes and stacked structures such as the shape allowing the first electrode 310 to be electrically connected to the first conductive layer 310 in an 'n' shape and the shape allowing the cavity capacitor to be formed at a center space between the first conductive layer 310 and the second conductive layer 320. As such, if the shape and stacked structure that the cavity capacitor is embedded in the printed circuit board are changed, it is obvious that the corresponding manufacture method may be different from that of FIG. 7A through FIG. 7D.

The principle of allowing a cavity capacitor embedded in a printed circuit board to be used as an electromagnetic bandgap structure in accordance with the present invention will be described in detail with reference to FIG. 9A through FIG. 12.

Figure 9A:
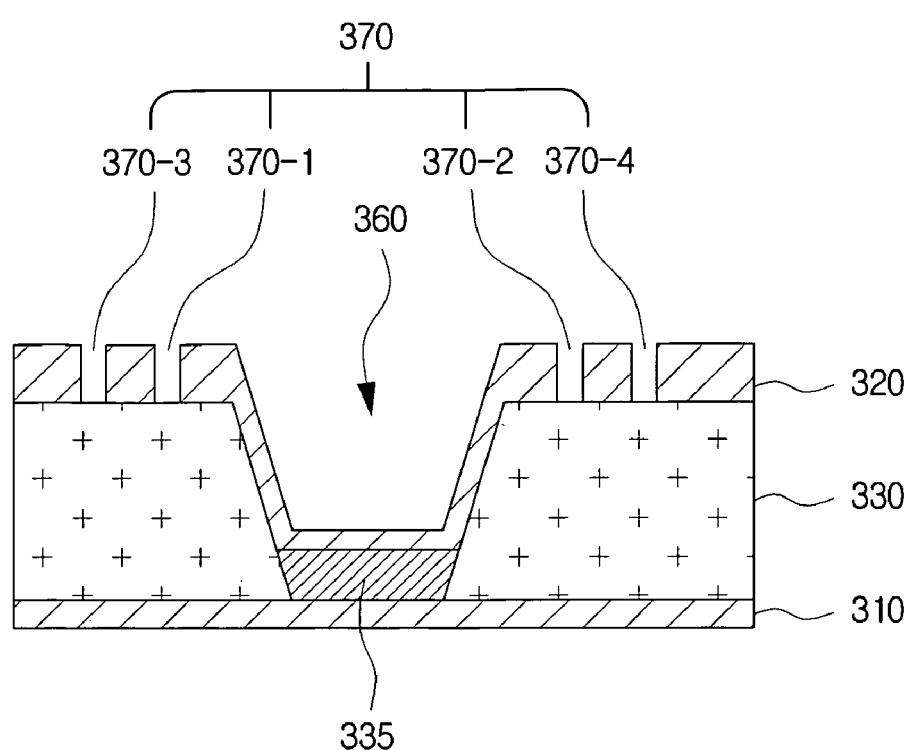
FIG. 9A is a side view showing a printed circuit board having an embedded cavity capacitor in accordance with a fourth embodiment of the present invention.
Figure 9B:
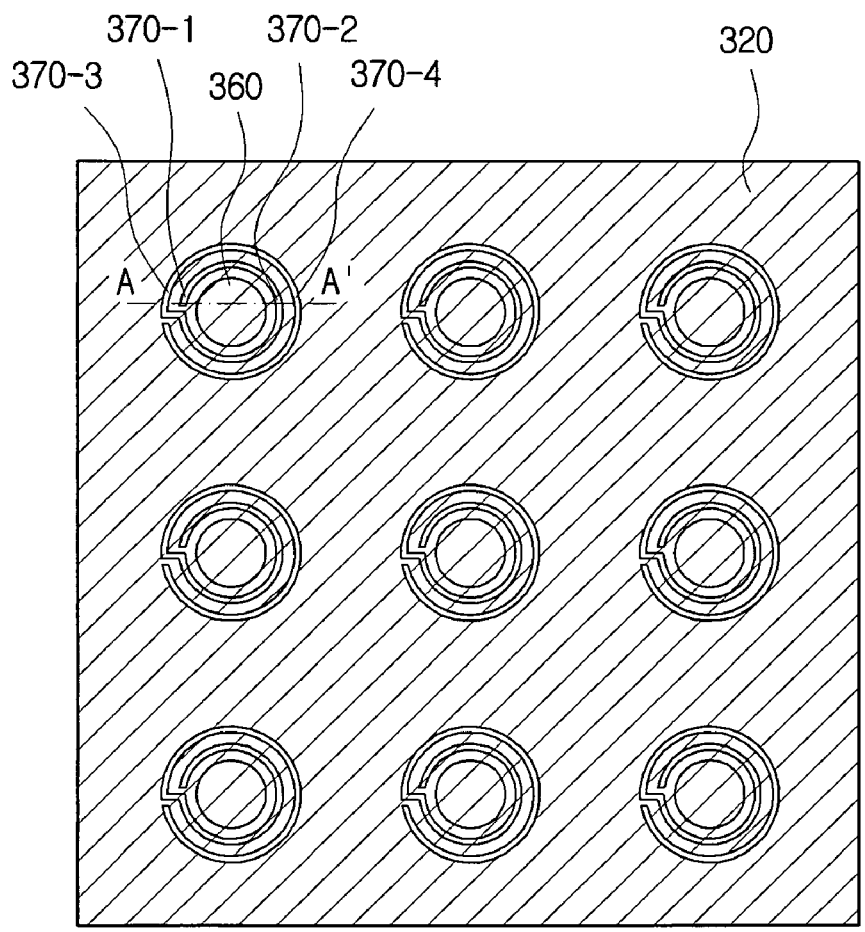
FIG. 9B illustrates the type of an etched pattern when the printed circuit board shown in FIG. 9A is viewed from an upper side.
Figure 9C:
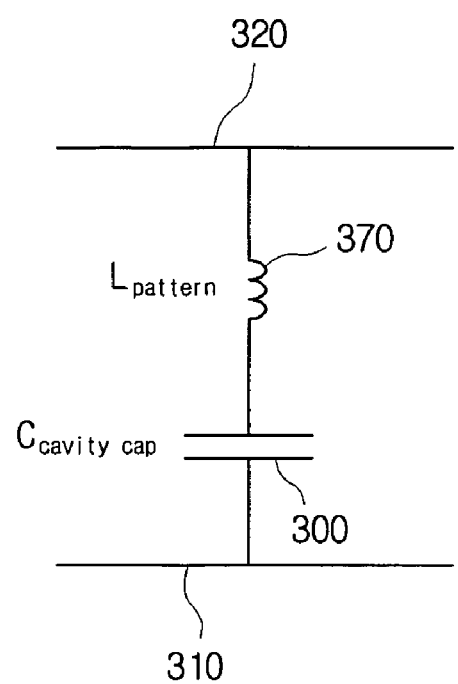
FIG. 9C is a schematic view showing an equivalent circuit of the cavity capacity shown in FIG. 9A.

FIG. 9A is a side view showing a printed circuit board having an embedded cavity capacitor in accordance with a fourth embodiment of the present invention, FIG. 9B illustrates the type of an etched pattern when the printed circuit board shown in FIG. 9A is viewed from an upper side and FIG. 9C is a schematic view showing an equivalent circuit of the cavity capacity shown in FIG. 9A.

Referring to FIG. 9A through 9B, it can be recognized that in the case of the printed circuit board having the embedded cavity capacitor in accordance with a fourth embodiment of the present invention, a surrounding area of a part corresponding to a position, formed with the cavity capacitor, of the second conductive layer 320 is being partially etched.

At this time, an etched pattern 370 formed in the second conductive layer 320 can have a spiral shape. As such, the etched pattern 370 having the spiral shape, which is the spiral type, can be manufactured in a pattern type having the maximum pattern length in a narrow area. Here, the etched pattern 370 formed in the second conductive layer 320 can function as an inductance component in the printed circuit board.

Accordingly, the etched pattern 370 having the spiral shape, formed in the conductive layer 320, can realize the inductance having the largest value in the narrow area or surface. In addition, the spiral type, which includes the self inductance, formed in a lengthwise direction, and the mutual inductance, formed by intersection between spiral type etched patterns (e.g. 370-1 and 370-3 or 370-2 and 370-4 in FIG. 9A and FIG. 9B), can easily realize a large inductance value.

Accordingly, in accordance with a fourth embodiment of the present invention, it can be considered that the printed circuit board having the embedded cavity capacitor, as described with reference to FIG. 9C, has the coupled structure in which the inductance component, formed by the spiral type etched pattern 370, and the capacitor component, formed by the cavity capacitor, are connected to each other in series between the first conductive layer 310 and the second conductive layer 320. Accordingly, in accordance with a fourth embodiment of the present invention, the printed circuit board having the embedded cavity capacitor can prevent the EM wave having a frequency band form being transferred.

In other words, the present invention can function as a band reject filter by using the LC series connection structure by the cavity capacitor and the etched pattern 370. More exactly, the present invention can function as the band reject filter through the 'structural property' of the printed circuit board, which is the LC series connection structure by the cavity capacitor and the etched pattern 370. Accordingly, the cavity capacitor can be used as an electromagnetic bandgap structure in the present invention.

At this time, the present invention can manufacture the etched pattern 370 having a desired inductance value by precisely designing and controlling the shape, length, width and area size of the etched pattern 370. Similarly, the present invention can manufacture the cavity capacitor having a desired capacitor value by precisely designing and controlling the shape, length, width and area size of the firstly formed cavity 360 and the type and dielectric constant of the dielectric material forming the second dielectric layer 335. As such, the present invention can prevent the EM wave having a frequency band necessary to be prevented by using the precisely controlled and designed inductance and capacitance values, to thereby solve the mixed signal and noise problems of the printed circuit board.

Although FIG. 9A through FIG. 9C illustrate the etched pattern 370 of the spiral type, the etched pattern 370 can be designed and manufactured in various types (e.g. a trace type and a bar type). However, the etched pattern 370 can have an open-curved shape. This is because if the etched pattern 370 has a closed-curved shape, the electrical connection between the second conductive layer 320 and the second electrode 320a (refer to FIG. 6) of the cavity capacitor is broken, which results in being unable to function as the capacitor. Accordingly, any etched pattern 370 having an open-curved shape capable of electrically connecting the cavity capacitor to the second conductive layer 320 can be applied to the present invention without restriction.

Figure 10A:
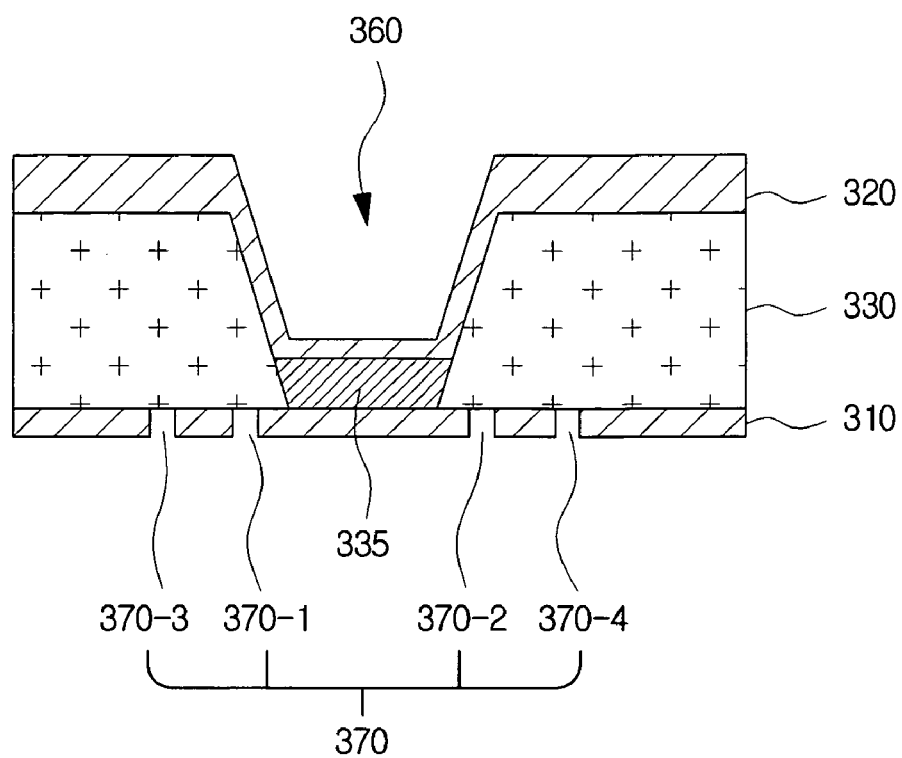
FIG. 10A is a side view showing a printed circuit board having an embedded cavity capacitor in accordance with a fifth embodiment of the present invention.
Figure 10B:
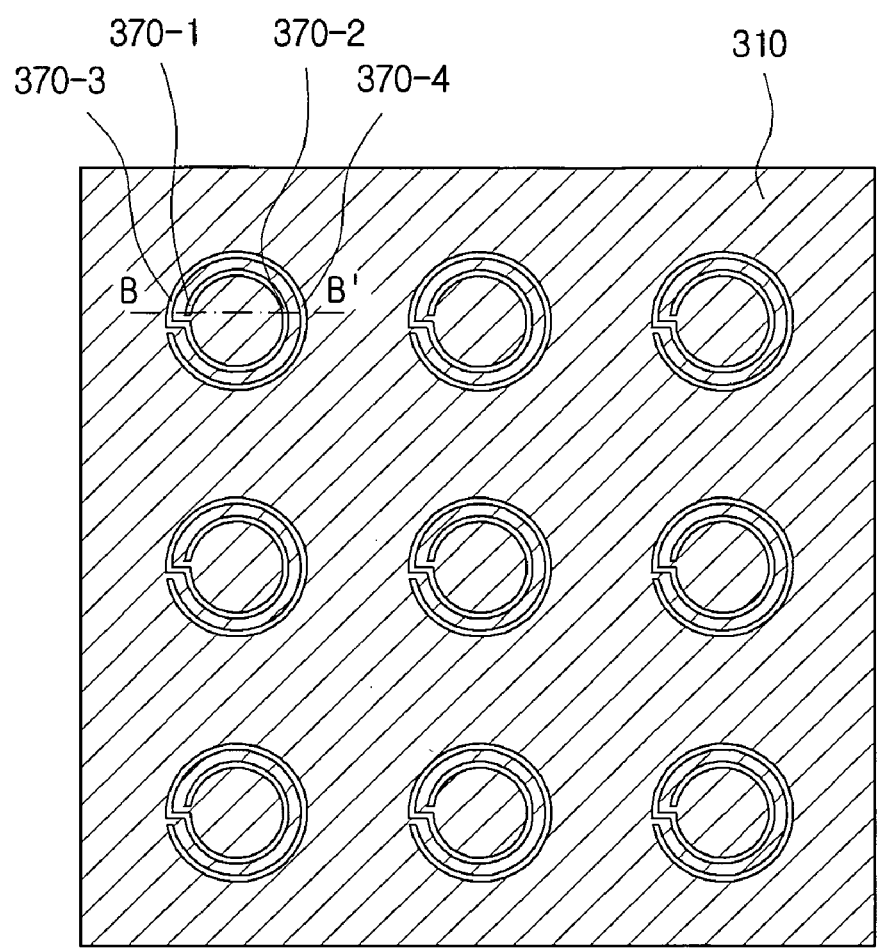
FIG. 10B illustrates the type of an etched pattern when the printed circuit board shown in FIG. 10A is viewed from an upper side.
Figure 10C:
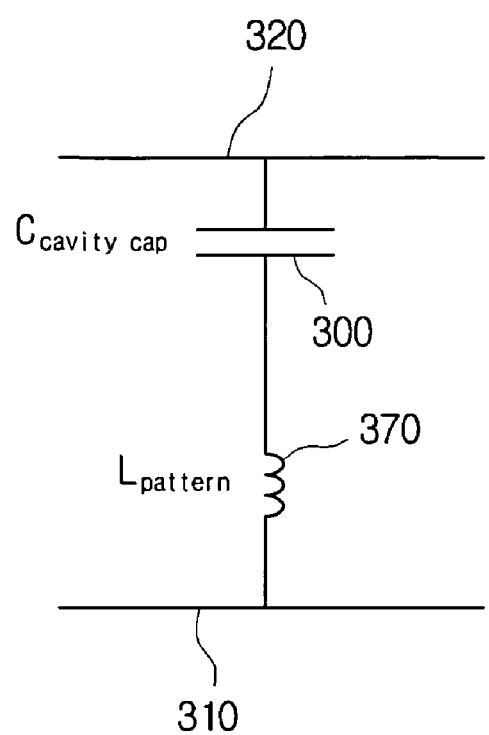
FIG. 10C is a schematic view showing an equivalent circuit of the cavity capacity shown in FIG. 10A.

Another embodiment having the LC series connection structure according to the cavity capacitor and the etched pattern 370 is illustrated through FIG. 10A through FIG. 10C. FIG. 10A through FIG. 10C illustrate the printed circuit board having the embedded cavity capacitor in which the spiral type etched pattern 370 is formed in a surrounding area of a part, formed with the cavity capacitor, in the first conductive layer 310 in accordance with a fifth embodiment of the present invention. In this case, the cavity capacitor can be used as the electromagnetic bandgap structure according to the same principle as the description with reference to FIG. 9A through FIG. 9B. Since this is obviously understandable through the following description, the detailed pertinent description will be omitted.

Even though FIG. 9A through FIG. 10C illustrate the case that the LC series connection structure functions through the coupling of the cavity capacitor and the etched pattern 370, it is natural that the printed circuit board having the cavity capacitor illustrated in FIG. 6 though FIG. 8B can similarly function as the electromagnetic bandgap structure. This is because the printed circuit board having the cavity capacitor illustrated in FIG. 6 though FIG. 8B can also realize an inductance value by the conductive material to be stacked in a lateral side part of the cavity 360 in FIG. 6 and FIG. 7D and the conductive material to be charged to the cavity 360 in FIG. 8A and FIG. 8B, for example. However, in the case of the printed circuit board having the cavity capacitor illustrated in FIG. 6 though FIG. 8B, it may be difficult to be changed in various ways (e.g. changing the shape, length, width and area size in the same case as forming the etched pattern 370) due to a lot of limitations in the aspect of design as compared with the case of forming the etched pattern 370.

FIG. 11A through FIG. 11f are examples illustrating a printed circuit board in which a cavity capacitor is arranged in a band structure in accordance with the present invention. Due to being based on the view from an upper side of the printed circuit board, FIG. 11A through FIG. 11f illustrate the cavity 360 of the cavity capacitor.

In FIG. 11A through FIG. 11f, a region A 410 and a region B indicates two regions necessary to prevent mutual interference, respectively, due to using different frequency bands. The below description assumes that the region A 410 is mounted with the RF circuit and the region B 420 is mounted with the digital circuit in the case of a mobile phone main board 400. In other words, if any one of the region A 410 and the region B 420 functions as a noise source in their mutual relationship, the other is determined as a noise prevented destination.

Through FIG. 11A through FIG. 11f, it can be recognized that at least one cavity capacitor is arranged in a path between the noise source and the noise prevented destination, placed in the printed circuit board. In other words, the present invention can use the method having and embedding at least one cavity capacitor on the pertinent noise-transferable path in order to prevent a mixed signal or noise having a frequency band, which is possible to be generated from an electrical element placed at the noise source and to have an affect on the other electrical element placed at the noise prevented destination.

Figure 11A:
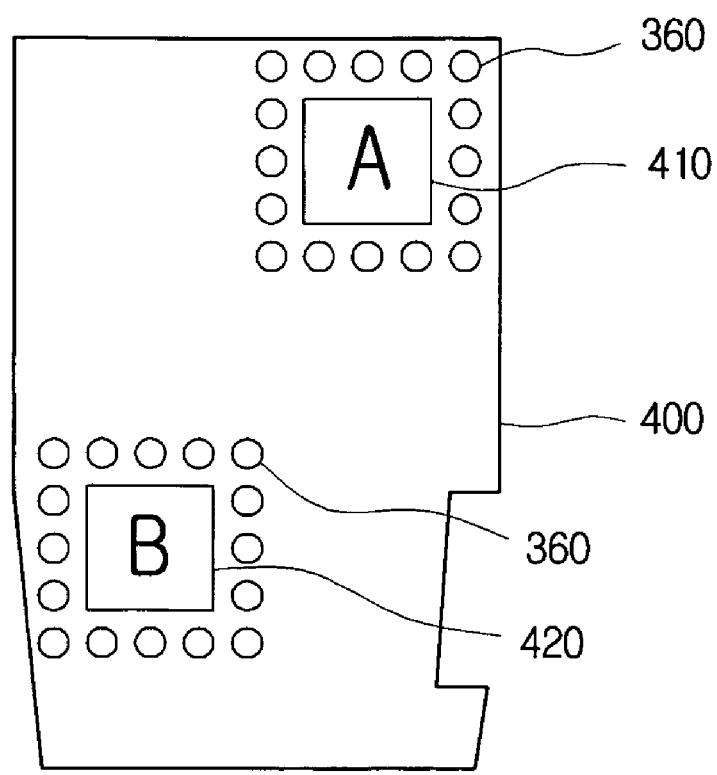
FIG. 11A through FIG. 11$f$ are examples illustrating a printed circuit board in which a cavity capacitor is arranged in a band structure in accordance with the present invention.
Figure 11B:
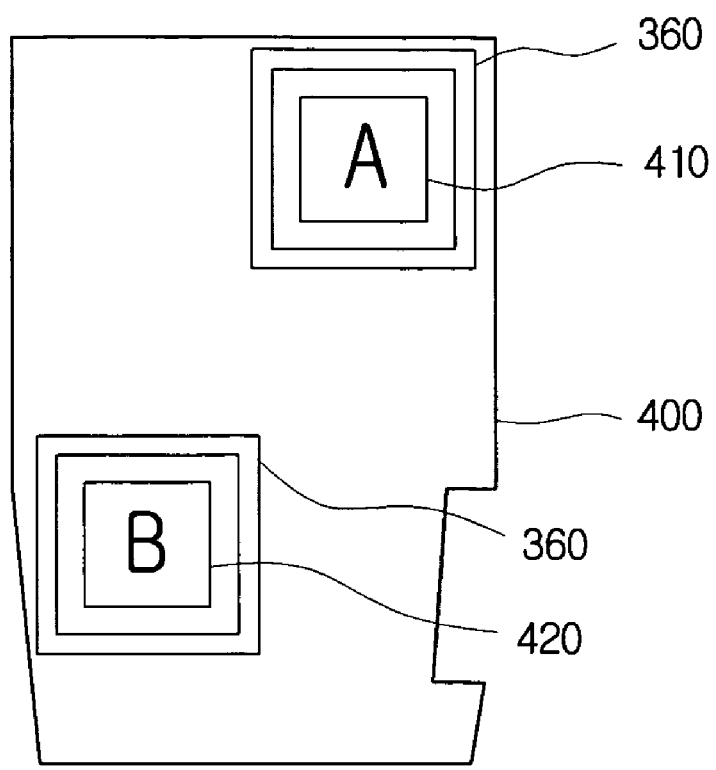

In particular, FIG. 11A shows a point-band structure in which the plurality of cavity capacitors are arranged to envelop the four sides of a region A 410 and a region B 420, respectively, in a closed loop shape, and FIG. 11B shows a line-band structure in which one cavity capacitor is arranged to envelop the four sides of the region A 410 and the region B 420, respectively. Of course, unlike FIG. 11A and FIG. 11B, it is possible to envelop either the noise source or the noise prevented destination.

Figure 11C:
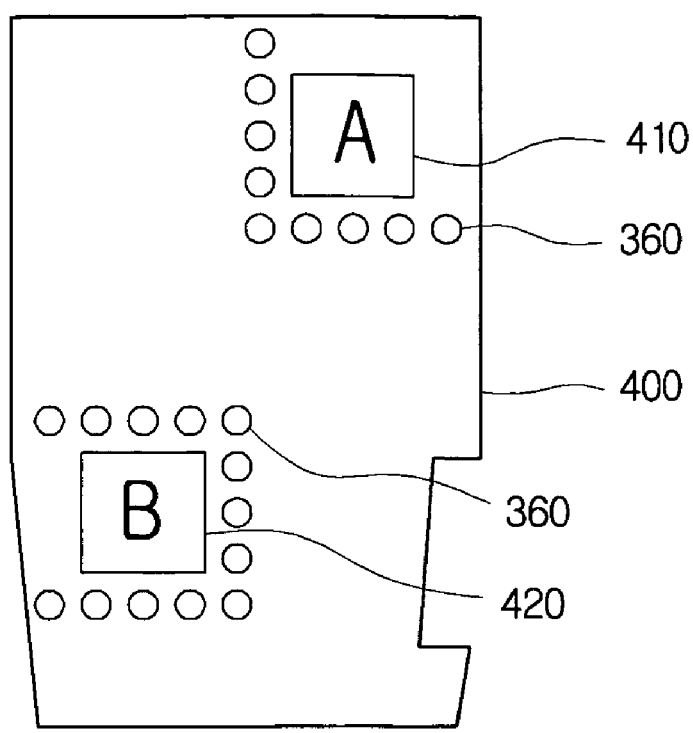
Figure 11D:
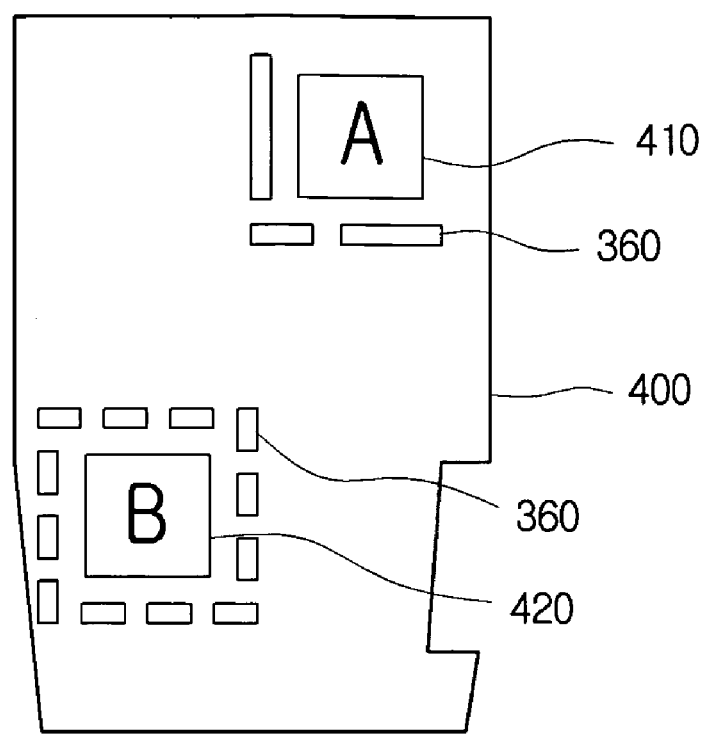

FIG. 11C shows the point-band structure in which a plurality of cavity capacitors envelops the two or three sides of the region A 410 and the region B 420, respectively, in a rectangular shape with one side open or an 'L' shape instead of enveloping the four sides as shown in FIG. 11A and FIG. 11B. As such, it is possible to envelop each region in the shape of the board with one side open. Accordingly, it is obvious that the band structure can have the shape having the rotational displacement of the rectangular shape with one side open or an 'L' shape according to the shape of the board and the position of the closed region.

FIG. 11A shows the cavity capacitors are arranged in the similar shape to those of FIG. 11A through FIG. 11C. However, the shape and length (or area size) of the cavity 360 are different. In accordance with the prevent invention, the cavity capacitors can be arranged in various ways as inferred through FIG. 11D.

In other words, it is unnecessary that the size, shape, area size and length, respectively, of the cavity capacitor are the same. At least one of the size, shape, area size and length of the plurality of cavity capacitors can be respectively or partially differently can be determined. Since these factors are closely related to a frequency band desired to be prevented, the factors can be optimally selected according to the prevented desired frequency band or the design specifications.

For example, if it is necessary to more broadly set the frequency band of the noise desired to be prevented, it can be preferable to alternately or repeatedly arrange the plurality of cavity capacitors having various size, shape, area size and length according to the necessary frequency band. Reversely, if it is necessary to more narrowly set and more accurately prevent the frequency band of the noise desired to be prevented, it can be preferable to arrange the cavity capacitors having the same size and shape at shorter intervals or repeatedly in a plurality of lines according to the necessary frequency band.

Figure 11E:
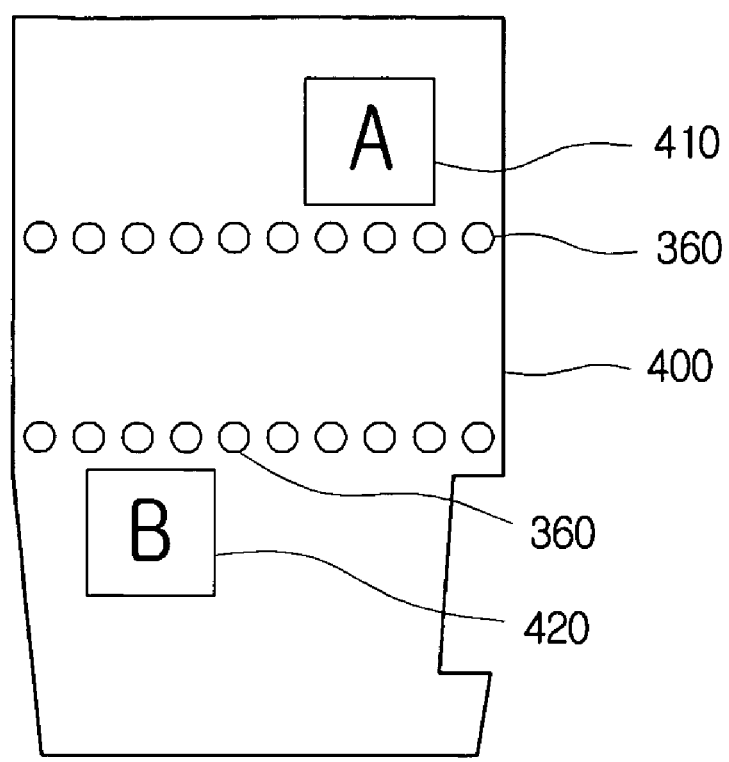
Figure 11F:
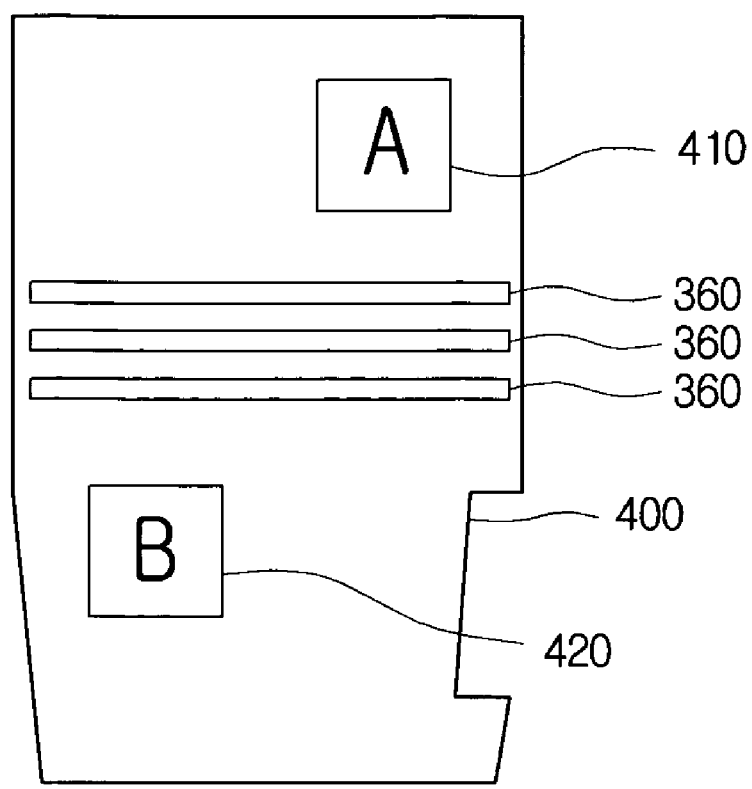

Unlike FIG. 11A through FIG. 11D, the FIG. 11E and FIG. 11F show that the cavity capacitors are arranged in point-band and line-band shapes, respectively, having at least one straight-line to separate the region A 410 and the region B 420 by crossing the area between the two regions, instead of enveloping each prevented region.

In addition to FIG. 11A through FIG. 11F, it is understandable to any person of ordinary skill in the art that the cavity capacitors can be arranged in the noise-transferable path between the noise source and the noise prevented destination in various ways.

Figure 12A:
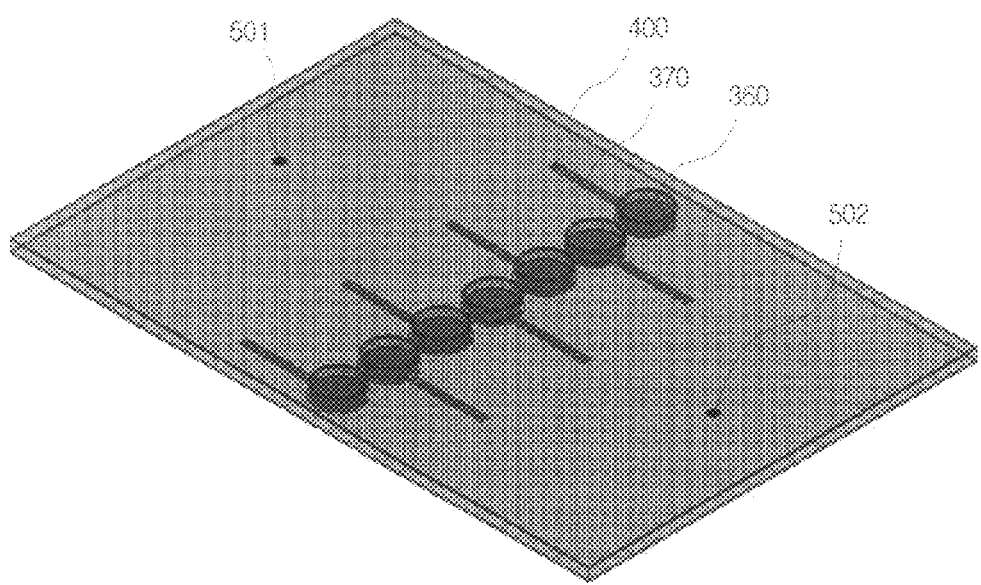
FIG. 12A illustrates a 3-D exemplary model for checking the usability as an electromagnetic bandgap structure by a cavity capacitor embedded in a printed circuit board in accordance with the present invention.
Figure 12B:
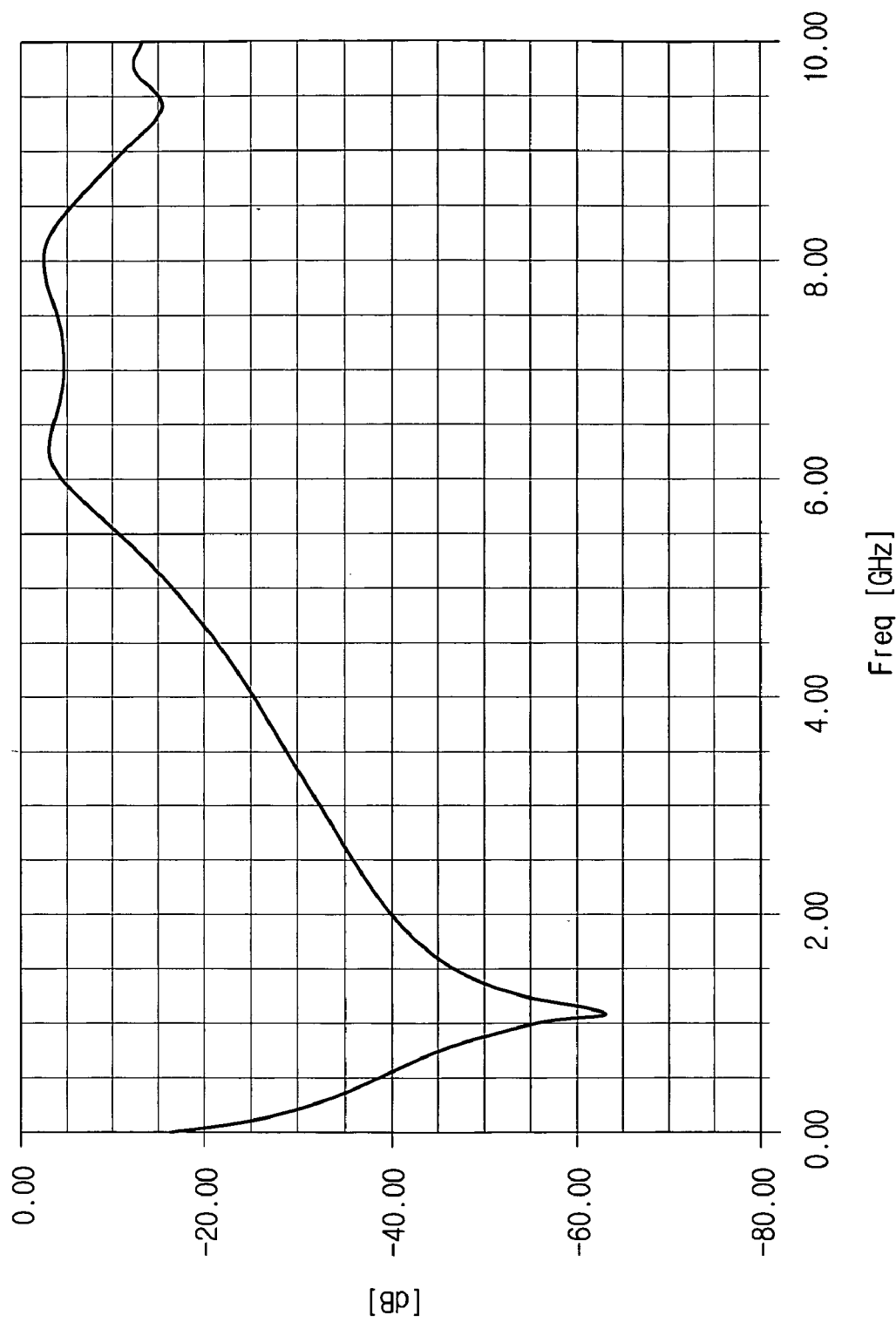
FIG. 12B shows a computer-simulation result when the 3-D exemplary model shown in FIG. 12A is applied.

FIG. 12A illustrates a 3-D exemplary model for checking the usability as an electromagnetic bandgap structure by a cavity capacitor embedded in a printed circuit board in accordance with the present invention, and FIG. 12B shows a computer-simulation result when the 3-D exemplary model shown in FIG. 12A is applied.

The 3-D exemplary model of FIG. 12A shows the one-band structure in which the printed circuit board 400 includes a noise point 501 and a measurement point 502 and the cavity capacitors and the bar-type etched pattern 370 are arranged at the position where the cavity 360 is formed between the noise point 501 and the measurement point 502. The graph of FIG. 12B is the computer simulation result showing how much noise supplied to the noise point 501 does reach the measurement point 502.

Referring to FIG. 12B, in the case of the 3-D exemplary model of FIG. 12A, it can be recognized that the bandgap frequency has an appropriately 0.5~2 GHz band on a basis of a (−) 40 db shield rate. Though this simulation result, it can be recognized again that the printed circuit board having the embedded cavity capacitor in accordance to the present invention can function as a band reject filter by the structural property.

Although the simulation result of FIG. 12B shows the bandgap frequency has the appropriately 0.5~2 GHz band, since each capacitance and inductance value is adjustable according to the configuration of the cavity capacitor, the shape, size, area size and thickness of the first formed cavity, the type and dielectric constant of the dielectric material forming the second dielectric layer 335 and the shape, width, length and area size of the etched pattern 370, the bandgap frequency is changeable depending on the design specifications.

Accordingly, the present invention can prevent the electromagnetic wave having the desired frequency band by using the cavity capacitor embedded in the printed circuit board as the electromagnetic bandgap structure. Also, due to using the cavity capacitor formed between the first conductive layer 310 and the second-conductive layer 320 as the electromagnetic bandgap structure, the present invention can have simpler structure than the conventional art (e.g. the mushroom by the metal plate and the via) in the aspects of manufacture process and structure. This can result in no design limitation and the difficulty of the configuration and the outstanding property in the aspect of signal integrity.

Hitherto, although some embodiments of the present invention have been shown and described for the above-described objects, it will be appreciated by any person of ordinary skill in the art that a large number of modifications, permutations and additions are possible within the principles and spirit of the invention, the scope of which shall be defined by the appended claims and their equivalents.

What is claimed is:

1. A printed circuit board having an embedded cavity capacitor, the printed circuit board comprising:
   two conductive layers to be used as a power layer and a ground layer, respectively; and
   a first dielectric layer, placed between the two conductive layers,
   wherein at least one cavity capacitor is arranged in a noise-transferable path between a noise source and a noise prevented destination which are placed on the printed circuit board, the cavity capacitor being formed to allow a second dielectric layer to have a lower stepped region than the first dielectric layer, and the second dielectric layer using the two conductive layers as a first electrode and a second electrode, respectively, and placed between the first electrode and the second electrode.

2. The printed circuit board of claim 1, wherein the printed circuit board is mounted with a digital circuit and an analog circuit, and the noise source and the noise prevented destination correspond to one and the other, respectively, of positions in which the digital circuit and the analog circuit are supposed to be mounted in the printed circuit board.

3. The printed circuit board of claim 1, wherein the second dielectric layer is formed to have a higher dielectric constant than the first dielectric layer.

4. The printed circuit board of claim 1, wherein the cavity capacitor uses any one of the two conductive layers as any one electrode as it is.

5. The board of claim 1, wherein the cavity capacitor has any one shape of a circle, an ellipse and a polygon when viewed from an upper part of the printed circuit board.

6. The printed circuit board of claim 1, wherein the cavity capacitor is formed close to any one of the two conductive layers,
whereas a conductive material is charged to a cavity formed in a space between the other conductive layer and the cavity capacitor.

7. The printed circuit board of claim 6, wherein the conductive material to be charged to the cavity is the same material as the other conductive layer or a conductive paste.

8. The printed circuit board of claim 1, wherein an etched pattern is formed in an open curved shape in a surrounding area of a part corresponding to the position in which the cavity capacitor is formed in any one of the two conductive layers.

9. The printed circuit board of claim 8, wherein the etched pattern has a spiral shape.

10. The printed circuit board of claim 8, wherein the cavity capacitor is coupled to an inductance component by the etched pattern, connected to the cavity capacitor in series, to intercept the transfer of an electromagnetic wave having a desired frequency band.

11. The printed circuit board of claim 1, wherein the cavity capacitor is arranged in a band structure in the noise transferable path.

12. The printed circuit board of claim 11, wherein the band structure has a shape enveloping at least one of the noise source and the noise prevented destination.

13. The printed circuit board of claim 12, wherein the band structure has any one of a closed loop shape, a rectangular shape with one side open, and an 'L' shape.

14. The printed circuit board of claim 11, wherein the band structure has a straight-line shape of at least one line to separate the noise source and the noise prevented destination by crossing the area between the noise source and the noise prevented destination.

15. The printed circuit board of claim 11, wherein the band structure has any one of a point-band structure by a plurality of cavity capacitors, a line-band structure by one cavity capacitor and a structure combined with the point-band structure and theline-band structure.

* * * * *

UNITED STATES PATENT AND TRADEMARK OFFICE
CERTIFICATE OF CORRECTION

| | | |
|---|---|---|
| PATENT NO. | : 7,983,055 B2 | Page 1 of 1 |
| APPLICATION NO. | : 12/010436 | |
| DATED | : July 19, 2011 | |
| INVENTOR(S) | : Han Kim et al. | |

It is certified that error appears in the above-identified patent and that said Letters Patent is hereby corrected as shown below:

Column 14, Line 26, in claim 15, delete "theline-band" and insert -- the line-band --, therefor.

Signed and Sealed this
Thirty-first Day of January, 2012

David J. Kappos
*Director of the United States Patent and Trademark Office*